(12) United States Patent
Kim

(10) Patent No.: US 9,178,084 B2
(45) Date of Patent: Nov. 3, 2015

(54) SOLAR CELL AND METHOD FOR MANUFACTURING THE SAME

(75) Inventor: Kyung Am Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 160 days.

(21) Appl. No.: 13/982,199

(22) PCT Filed: Oct. 6, 2011

(86) PCT No.: PCT/KR2011/007398
§ 371 (c)(1),
(2), (4) Date: Oct. 11, 2013

(87) PCT Pub. No.: WO2012/102452
PCT Pub. Date: Aug. 2, 2012

(65) Prior Publication Data
US 2014/0026954 A1      Jan. 30, 2014

(30) Foreign Application Priority Data

Jan. 26, 2011   (KR) .................. 10-2011-0007678

(51) Int. Cl.
| H01L 31/0224 | (2006.01) |
| H01L 31/0749 | (2012.01) |
| H01L 31/046 | (2014.01) |

(52) U.S. Cl.
CPC ...... *H01L 31/022441* (2013.01); *H01L 31/046* (2013.01); *H01L 31/0749* (2013.01); *Y02E 10/541* (2013.01)

(58) Field of Classification Search
CPC .............. H01L 31/046; H01L 31/0463; H01L 31/0465; H01L 31/022441; H01L 31/0749; H01L 27/142
USPC ........................................................... 136/249
See application file for complete search history.

(56) References Cited

U.S. PATENT DOCUMENTS

| 4,465,894 A | * | 8/1984 | Reyes ........................... 136/225 |
| 4,668,840 A | * | 5/1987 | Kiyama et al. ................ 136/244 |
| 4,808,242 A | * | 2/1989 | Murata et al. ................. 136/244 |
| 5,320,685 A | * | 6/1994 | Hilgarth et al. ............... 136/244 |

(Continued)

FOREIGN PATENT DOCUMENTS

| JP | 2005-191167 A | 7/2005 |
| KR | 10-2010-0109314 A | 10/2010 |
| KR | 10-2010-0109319 A | 10/2010 |

OTHER PUBLICATIONS

Machine translation of KR 10-2010-0109319; published Oct. 8, 2010; printed Feb. 20, 2015.*

(Continued)

*Primary Examiner* — Allison Bourke
*Assistant Examiner* — Edward Schmiedel
(74) *Attorney, Agent, or Firm* — Saliwanchik, Lloyd & Eisenschenk

(57) ABSTRACT

Disclosed are a solar cell and a method for manufacturing the same. The solar cell includes a support substrate; a back electrode layer on the support substrate, the back electrode layer being formed with at least one first through hole to expose a part of a top surface of the support substrate; a light absorbing layer on the back electrode layer; a buffer layer on the light absorbing layer; a window layer on the buffer layer; and a high-resistance region on a lateral side of the back electrode layer forming the first through hole. The high-resistance region has a resistance value higher than a resistance value of the light absorbing layer.

8 Claims, 2 Drawing Sheets

(56) References Cited

U.S. PATENT DOCUMENTS

| | | | |
|---|---|---|---|
| 5,468,988 A * | 11/1995 | Glatfelter et al. | 257/431 |
| 2006/0112987 A1* | 6/2006 | Nakata et al. | 136/256 |
| 2007/0200192 A1* | 8/2007 | Shinohara | 257/448 |
| 2008/0102024 A1* | 5/2008 | Bae et al. | 423/648.1 |
| 2008/0314439 A1* | 12/2008 | Misra | 136/249 |
| 2009/0272432 A1* | 11/2009 | Lu et al. | 136/256 |
| 2009/0283131 A1 | 11/2009 | Kushiya et al. | |

OTHER PUBLICATIONS

International Search Report in International Application No. PCT/KR2011/007398, filed Oct. 6, 2011.

* cited by examiner

SOLAR CELL AND METHOD FOR MANUFACTURING THE SAME

CROSS-REFERENCE TO RELATED APPLICATION

This application is the U.S. national stage application of International Patent Application No. PCT/KR2011/007398, filed Oct. 6, 2011, which claims priority to Korean Application No. 10-2011-0007678, filed Jan. 26, 2011, the disclosures of each of which are incorporated herein by reference in their entirety.

TECHNICAL FIELD

The embodiment relates to a solar cell and a method for manufacturing the same.

BACKGROUND ART

Recently, as energy consumption is increased, the development on a solar cell to convert solar energy into electrical energy has been performed.

In particular, a CIGS-based solar cell has been extensively used, in which the CIGS-based solar cell is a PN hetero junction device having a substrate structure including a glass substrate, a metallic back electrode layer, a P type CIGS-based light absorbing layer, a high-resistance buffer layer, and an N type transparent electrode layer.

In addition, in order to increase the efficiency of the solar cell, various studies have been performed.

DISCLOSURE OF INVENTION

Technical Problem

The embodiment provides a solar cell capable of improving reliability by reducing leakage current and a method for manufacturing the same.

Solution to Problem

A solar cell according to the embodiment includes a support substrate; a back electrode layer on the support substrate, the back electrode layer being formed with at least one first through hole to expose a part of a top surface of the support substrate; a light absorbing layer on the back electrode layer; a buffer layer on the light absorbing layer; a window layer on the buffer layer; and a high-resistance region on a lateral side of the back electrode layer forming the first through hole, the high-resistance region having a resistance value higher than a resistance value of the light absorbing layer.

A method for manufacturing a solar cell according to the embodiment includes the steps of forming a protrusion having a stripe shape on a part of a support substrate; forming a back electrode layer on the substrate and the protrusion such that the back electrode layer has a height lower than a height of the protrusion; removing the protrusion; forming a light absorbing layer on the back electrode layer; forming a buffer layer on the light absorbing layer; and forming a window layer on the buffer layer.

Advantageous Effects of Invention

According to the embodiment, since the through hold, which is formed by etching a part of the back electrode layer such that the support substrate can be partially exposed, has a width gradually narrowed upward, the light absorbing layer prepared to fill the through hole may not completely fill the through hole, so that the light absorbing layer is partially spaced apart from the lateral side of the back electrode layer forming the through hole.

Therefore, the high-resistance region having resistance higher than that of the light absorbing layer is formed at the lateral side of the back electrode layer forming the through hole, so the leakage current occurring at the back electrode layer divided by the through hole may be reduced, thereby improving the reliability of the device.

MODE FOR THE INVENTION

Figure 1:
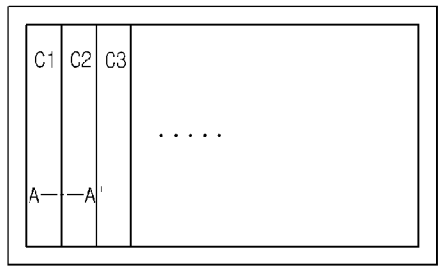
FIG. 1 is a plan view showing a solar cell according to the embodiment.

In the description of the embodiments, it will be understood that, when a layer (or film), a region, a pattern, or a structure is referred to as being 'on' or 'under' another substrate, another layer (or film), another region, another pad, or another pattern, it can be directly or indirectly on the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Figure 2:
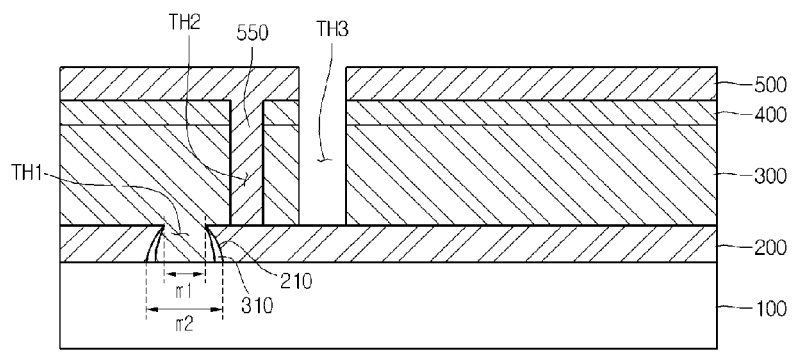
FIG. 2 is a sectional view taken along line A-A' of FIGS. 1.

FIG. 1 is a plan view showing a solar cell according to the embodiment, and FIG. 2 is a sectional view taken along line A-A' of FIG. 1.

Referring to FIGS. 1 and 2, the solar cell according to the embodiment includes a support substrate 100, a back electrode layer 200, a light absorbing layer 300, a buffer layer 400 and a window layer 500.

The support substrate 100 has a plate shape and supports the back electrode layer 200, the light absorbing layer 300, the buffer layer 400, and the window layer 500.

The support substrate 100 may include an insulator. The support substrate 100 may include a glass substrate, a plastic substrate, or a metallic substrate. In more detail, the support substrate 100 may include a soda lime glass substrate. The support substrate 100 may be transparent. The support substrate 100 may be rigid or flexible.

The back electrode layer 200 is provided on the support substrate 100. The back electrode layer 200 is a conductive layer. The back electrode layer 200 may include a metal, such as molybdenum.

The back electrode layer 200 may include at least two layers. In this case, the layers include the same metal, or different metals.

First through holes TH1 are formed in the back electrode layer 200. The first through holes TH1 are open regions to expose the top surface of the support substrate 100. The first through holes TH1 may extend in one direction when viewed in a plan view.

The width of the first through holes TH1 is in the range of about 40 μm to about 100 μm.

The back electrode layer 200 is divided into a plurality of back electrodes by the first through holes TH1. In other words, the back electrodes are defined by the first through holes TH1.

The back electrodes are spaced apart from each other by the first through holes TH1. The back electrodes are arranged in the shape of a stripe.

In addition, the back electrodes may be arranged in the form of a matrix. In this case, the first through holes TH1 may be configured in the form of a lattice when viewed in a plan view.

A lower width m2 of the first through hole TH1 may be larger than an upper width m1 of the first through hole TH1. In detail, the width of the first through hole TH1 is gradually narrowed upward. The upper width m1 of the first through hole TH1 is in the range of 60 µm to 70 µm, and the lower width m2 of the first through hole TH1 is in the range of 60 µm to 150 µm.

A lateral side 210 of the back electrode layer 200 forming the first through holes TH1 may have a curvature surface. In detail, the lateral side 210 of the back electrode layer 200 has the gradient which is not vertical to the support substrate 100. In addition, the lateral side 210 of the back electrode layer 200 may have the gradient gradually smoothed upward from the support substrate 100.

The light absorbing layer 300 may be formed on the back electrode layer 200. In addition, materials included in the light absorbing layer 300 may be filled in the first through holes TH1. Since the width of the first through holes TH1 is gradually narrowed upward, the first through holes TH1 may not be fully filled with the light absorbing layer 300, so a high-resistance region 310 may be formed at the lateral side 210 of the back electrode layer 200. The high-resistance region 310 may have a width, which is gradually narrowed upward from the support substrate 100.

The high-resistance region 310 has resistance higher than that of the light absorbing layer 300 and air may exist in the high-resistance region 310. Thus, current may be prevented from flowing to the back electrode layer 200 divided by the first through holes TH1 and the light absorbing layer 300 filling the first through holes TH1 due to the high-resistance region 310, so the leakage current can be reduced.

The light absorbing layer 300 includes group I-III-V compounds. For example, the light absorbing layer 300 may have a Cu—In—Ga—Se-based (Cu(In,Ga)Se$_2$;CIGS) crystal structure, a Cu—In—Se-based crystal structure, or a Cu—Ga—Se based crystal structure.

The light absorbing layer 300 may have bandgap energy of about 1 eV to 1.8 eV.

A plurality of light absorbing sections are defined in the light absorbing layer 300 by the second through holes TH2. In detail, the light absorbing layer 300 is divided into the light absorbing sections by the second through holes TH2.

The buffer layer 400 is formed on the light absorbing layer 300. In the solar cell according to the embodiment, a PN junction is formed between the light absorbing layer 300, which is a P type semiconductor including a CIGS compound thin film or a CIGSS compound thin film, and the window layer 500, which is an N type semi-conductor. However, since the above two materials represent great difference in a lattice constant and bandgap energy, a buffer layer having intermediate bandgap between the band gaps of the two materials is required in order to form the superior junction.

The buffer layer 400 includes CdS and has the energy bandgap of about 2.2 eV to about 2.4 eV.

The second through holes TH2 are formed in the light absorbing layer 300 and the buffer layer 400. The second through holes TH2 are open regions to expose the top surface of the back electrode layer 200.

The second through holes TH2 are adjacent to the first through holes TH1. In detail, the second through holes TH2 are aligned next to the first through holes TH1 when viewed in a plan view.

The second through holes TH2 may have a width of about 40 µm to about 100 µm.

The window layer 500 is formed on the buffer layer 400. The window layer 500 is a transparent conductive layer. In addition, the resistance of the window layer 500 is higher than the resistance of the back electrode layer 200. For instance, the resistance of the window layer 500 is higher than the resistance of the back electrode layer 200 by 10 times to 200 times.

The window layer 500 includes an oxide. For example, the window layer 500 may include zinc oxide, indium tin oxide (ITO), or indium zinc oxide (IZO).

In addition the oxide may include conductive impurities such as aluminum (Al), alumina ($Al_2O_3$), magnesium (Mg), or gallium (Ga). In more detail, the window layer 500 may include Al doped zinc oxide (AZO) or Ga doped zinc oxide (GZO).

Connection parts 550 are disposed in the second through holes TH2. The connection parts 550 extend downward from the window layer 500 to make contact with the back electrode layer 200. For instance, the connection parts 550 extend from a window of a first cell and are connected to a back electrode of a second cell.

Thus, adjacent cells are connected to each other by the connection parts 550. In detail, the windows of the cells C1, C2 . . . and Cn are connected to the back electrodes of the C1, C2 . . . and Cn by the connection parts 550.

The connection parts 550 are integrally formed with the window layer 500. In detail, the material for the connection parts 550 is the same as the material for the window layer 500.

Third though holes TH3 are formed in the light absorbing layer 300, the buffer layer 400 and the window layer 500. The third though holes TH3 are open regions to expose the top surface of the back electrode layer 200. For instance, the third through holes TH3 may have a width of about 80 µm to about 200 µm.

The third through holes TH3 are adjacent to the second through holes TH2. In detail, the third through holes TH3 are aligned next to the second through holes TH2. In more detail, the third through holes TH3 are aligned next to and parallel to the second through holes TH2 when viewed in a plan view.

The buffer layers are divided into a plurality of buffers by the third through holes TH3.

In addition, the window layer 500 is divided into a plurality of windows by the third through holes TH3. In detail, the windows are defined by the third through holes TH3.

The windows have shapes corresponding to the shapes of the back electrodes. In detail, the windows are aligned in the form of a stripe. In addition, the windows may be aligned in the form of a matrix.

Further, the cells C1, C2 . . . and Cn are defined by the third through holes TH3. In detail, the cells C1, C2 . . . and Cn are defined by the second and third through holes TH2 and TH3. In other words, the solar cell according to the embodiment is divided into the cells C1, C2 . . . and Cn by the second and third through holes TH2 and TH3.

As described above, since the high-resistance region 310 having resistance higher than that of the light absorbing layer 300 is formed at the lateral side 210 of the back electrode layer 200 forming the first through holes TH1, the leakage current occurring at the back electrode layer divided by the first through holes TH1 may be reduced, so that the reliability of the device can be improved.

FIGS. 3 to 9 are sectional views showing a method for manufacturing the solar cell according to the embodiment. The details of the method for manufacturing the solar cell will be given based on the description about the solar cell that has been described above.

Figure 3:
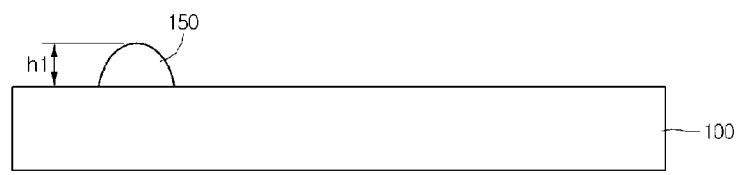
FIGS. 3 to 9 are sectional views showing a method for manufacturing a solar cell according to the embodiment.
Figure 4:
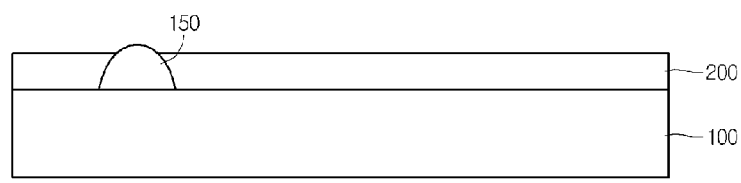
Figure 5:
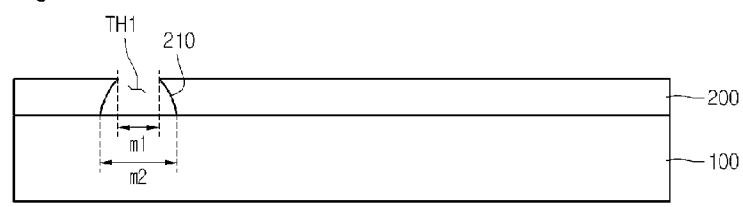

Referring to FIGS. 3 to 5, a protrusion 150 is formed on the support substrate 100.

The protrusion 150 has a stripe shape extending in one direction when viewed in a plan view.

The protrusion 150 may include photoresist or polymethylmethacrylate, which is a polymer compound, but the embodiment is not limited thereto. For instance, the protrusion 150 may include various materials, which can be cured by light or heat and easily removed by cleaning solution. A surface of the protrusion 150 may be curved or may have a width gradually narrowed upward.

Then, a photo curing process or a thermal curing process is performed with respect to the protrusion 150. Thus, the protrusion 150 is hardened, so that the back electrode layer 200 can be easily formed.

After that, the back electrode layer 200 is deposited on the support substrate 100 and the protrusion 150. The back electrode layer 200 is aligned lower than a height hl of the protrusion 150. Then, the protrusion 150 is removed to form the first through holes TH1. The protrusion 150 can be removed by using strip solution, such as acetone or $H_2SO_4$. At this time, the protrusion 150 may partially remain at the lateral side 210 of the back electrode layer 200. Thus, a plurality of back electrodes are formed on the support substrate 100.

The top surface of the support substrate 100 is exposed through the first through holes TH1 having the lower width m2 larger than the upper width m1.

In addition, an additional layer, such as a diffusion barrier layer, may be formed between the support substrate 100 and the back electrode layer 200. In this case, the top surface of the additional layer is also exposed through the first through holes TH1.

Figure 6:
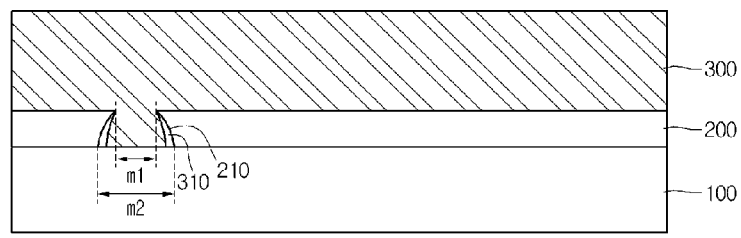

Referring to FIG. 6, the light absorbing layer 300 is formed on the back electrode layer 200. The light absorbing layer 300 may be formed through a sputtering process or an evaporation scheme.

For example, the light absorbing layer 300 may be formed through various schemes such as a scheme of forming a Cu(In,Ga)Se2 (CIGS) based-light absorbing layer 300 by simultaneously or separately evaporating Cu, In, Ga, and Se and a scheme of performing a selenization process after a metallic precursor film has been formed.

Regarding the details of the selenization process after the formation of the metallic precursor layer, the metallic precursor layer is formed on the back contact electrode 200 through a sputtering process employing a Cu target, an In target, or a Ga target.

Thereafter, the metallic precursor layer is subject to the selenization process so that the Cu(In,Ga)Se$_2$ (CIGS) based-light absorbing layer 300 is formed.

Different from the above, the sputtering process employing the Cu target, the In target, and the Ga target and the selenization process may be simultaneously performed.

In addition, a CIS-based or a CIG-based light absorbing layer 300 may be formed through a sputtering process employing only Cu and In targets or only Cu and Ga targets and the selenization process.

Although the light absorbing layer 300 is grown while filling the first through holes TH1, since the first through holes TH1 have the width gradually narrowed upward, the first through holes TH1 may not be fully filled with the light absorbing layer 300 and air exists at the lateral side 210 of the back electrode layer 200. Thus, the high-resistance region 310 is formed due to the air. The high-resistance region 310 has the resistance higher than that of the light absorbing layer 300 and prevents the current from flowing to the lateral side of the back electrode layer 200.

Figure 7:
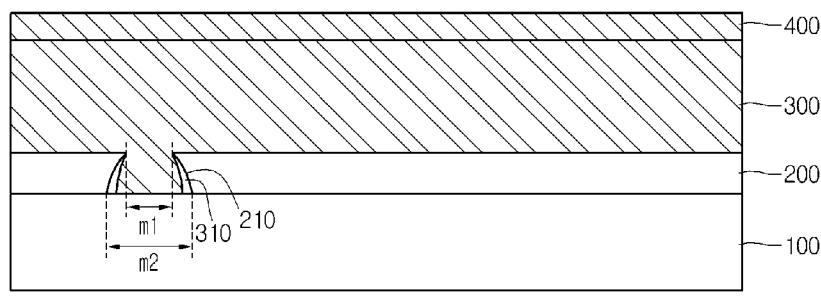

Referring to FIG. 7, the buffer layer 400 is formed on the light absorbing layer 300. For instance, the buffer layer 400 can be formed through the PVD (physical vapor deposition) or the MOCVD (metal-organic chemical vapor deposition).

Figure 8:
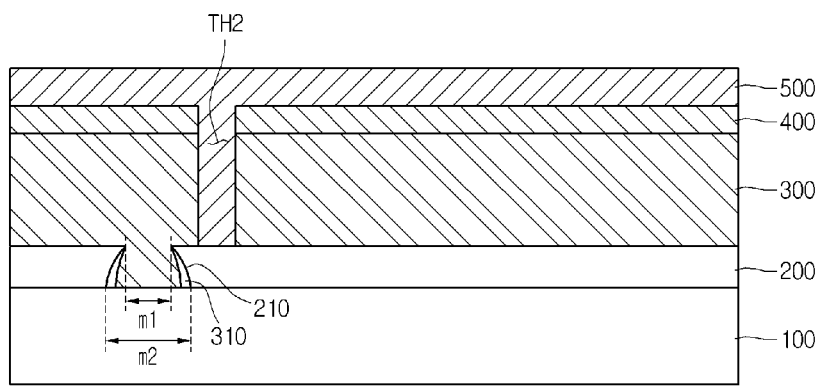

Referring to FIG. 8, the light absorbing layer 300 and the buffer layer 400 are partially removed, thereby forming the second through holes TH2.

The second through holes TH2 may be formed through a mechanical device such as a tip or a laser.

For example, the light absorbing layer 300 and the buffer layer 400 may be patterned by the tip having a width of about 40 μm to about 180 μm. In addition, the second through holes TH2 may be formed by the laser having the wavelength of about 200 nm to about 600 nm.

The second through holes TH2 may have a width in the range of about 40 μm to about 150 μm. In addition, the second through holes TH2 expose portions of the top surface of the back electrode layer 200.

Then, the window layer 500 is formed on the buffer layer 400 and in the second through holes TH2. In other words, the window layer 500 is formed by depositing a transparent conductive material on the buffer layer 400 and in the second through holes TH2.

In this case, the transparent conductive material is filled in the second through holes TH2, and the window layer 500 directly makes contact with the back electrode layer 200.

In this case, the window layer 500 may be formed by depositing a transparent conductive material under the oxygen-free atmosphere. In more detail, the window layer 500 may be formed by depositing zinc oxide under the inert gas atmosphere containing no oxygen.

Figure 9:
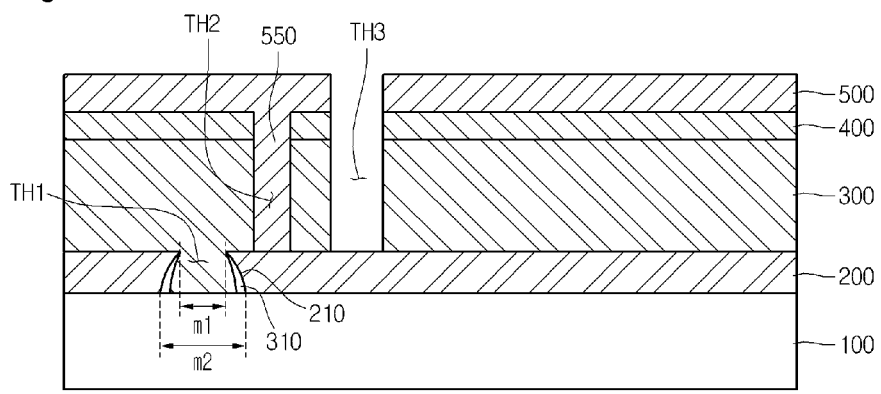

Referring to FIG. 9, the light absorbing layer 300, the buffer layer 400, and the window layer 500 are partially removed to form third through holes TH3. Accordingly, the window layer 500 is patterned, thereby defining a plurality of windows and a plurality of cells C1, C2 and Cn. The width of each third through hole TH3 may be in the range of about 80 μm to about 200 μm.

As described above, according to the method for manufacturing the solar cell of the embodiment, the high-resistance region 310 having resistance higher than that of the light absorbing layer 300 is formed at the lateral side 210 of the back electrode layer 200 forming the first through holes TH1, so the leakage current occurring at the back electrode layer 200 divided by the first through holes TH1 may be reduced, thereby improving the reliability of the device.

Any reference in this specification to 'one embodiment', 'an embodiment', 'example embodiment', etc., means that a particular feature, structure, or characteristic described in connection with the embodiment is included in at least one embodiment of the invention. The appearances of such phrases in various places in the specification are not necessarily all referring to the same embodiment.

Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a support substrate;
   a back electrode layer on the support substrate, the back electrode layer being formed with a first through hole to expose a part of a top surface of the support substrate;
   a light absorbing layer on the back electrode layer and including a portion of the light absorbing layer partially filling the first through hole such that a gap is formed between a lateral side of the first through hole and a lateral side of the portion of the light absorbing layer partially filling the first through hole;
   a buffer layer on the light absorbing layer;
   a window layer on the buffer layer;
   wherein the gap includes air, and forms a resistance region present between the lateral side of the portion of the light absorbing layer partially filling the first through hole, the lateral side of the first through hole, and the top surface of the support substrate, the high-resistance region having a resistance higher than a resistance of the light absorbing layer.

2. The solar cell of claim 1, wherein a lower width of the first through hole is larger than an upper width of the first through hole.

3. The solar cell of claim 2, wherein a width of the high-resistance region gradually decreases in an upward direction from the support substrate from the lower width of the first through hole to the upper width of the first through hole.

4. The solar cell of claim 2, wherein the upper width of the first through hole is in a range of about 60 μm to about 70 μm.

5. The solar cell of claim 2, wherein the lower width of the first through hole is in a range of about 60 μm to about 150 μm.

6. The solar cell of claim 1, further comprising photoresist or acryl formed at the lateral side of the back electrode layer forming the first through hole.

7. The solar cell of claim 1, wherein the lateral side of the back electrode layer forming the first through hole is curved.

8. The solar cell of claim 1, wherein the back electrode layer comprises a rounded end portion.

* * * * *